United States Patent
To

(10) Patent No.: US 12,388,432 B1
(45) Date of Patent: Aug. 12, 2025

(54) SELECT SIGNAL DUTY CYCLE ADJUSTMENT

(71) Applicant: Cadence Design Systems, Inc., San Jose, CA (US)

(72) Inventor: Yat-Loong To, Toronto (CA)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 18/535,010

(22) Filed: Dec. 11, 2023

Related U.S. Application Data

(60) Provisional application No. 63/433,066, filed on Dec. 16, 2022.

(51) Int. Cl.
| | | |
|---|---|---|
| *H03K 7/08* | (2006.01) | |
| *H03K 5/156* | (2006.01) | |
| *H03K 17/00* | (2006.01) | |
| *H03K 19/21* | (2006.01) | |

(52) U.S. Cl.
CPC ......... *H03K 17/005* (2013.01); *H03K 5/1565* (2013.01); *H03K 19/21* (2013.01)

(58) Field of Classification Search
CPC .......... H03K 3/01; H03K 3/017; H03K 5/156; H03K 5/1565; H03K 7/08; H03K 17/002; H03K 17/005; H03K 19/20; H03K 19/21; H03K 19/1737; G06F 1/04; G06F 1/06; G06F 1/08; G06F 1/10
See application file for complete search history.

(56) References Cited

U.S. PATENT DOCUMENTS

| | | | | |
|---|---|---|---|---|
| 10,841,072 | B2 * | 11/2020 | Huang | ..................... H04L 7/048 |
| 12,068,748 | B2 * | 8/2024 | Rao | ............................ G06F 1/08 |
| 2021/0028919 | A1 * | 1/2021 | Huang | ..................... H04L 7/042 |

* cited by examiner

*Primary Examiner* — Long Nguyen
(74) *Attorney, Agent, or Firm* — Mark H. Whittenberger; Holland & Knight LLP

(57) ABSTRACT

An N-input (e.g., 4) multiplexor may receive N number of select signals. Select signal generating circuitry may receive N number of clock signals at a phase spacing that is substantially at 360 degrees divided by N (e.g., 90 degrees for N=4). The select signal generating circuitry may produce a coarse set of N number of select signals that may have unequal duty cycles and/or overlap. Duty cycle feedback control loops may be used to adjust respective duty cycles of the coarse select signals to produce select signals that have equal duty cycles and do not overlap.

19 Claims, 12 Drawing Sheets

GENERATE, FROM N NUMBER OF CLOCK SIGNALS THAT ARE SUBSTANTIALLY PHASE SPACED AT 360 DEGREES DIVIDED BY N, A FIRST SET OF N NUMBER OF SELECT SIGNALS, WHERE N IS A POSITIVE INTEGER GREATER THAN THREE
702

ADJUST, USING A FIRST DUTY CYCLE CONTROL LOOP, RESPECTIVE DUTY CYCLES OF THE FIRST SET OF N NUMBER OF SELECT SIGNALS TO PRODUCE A SECOND SET OF N NUMBER OF SELECT SIGNALS
704

BASED ON RESPECTIVELY ACTIVATED ONES OF THE SECOND SET OF N NUMBER OF SELECT SIGNALS, SELECTING A CORRESPONDING INPUT SIGNAL TO BE OUTPUT.
706

*FIG. 7*

```
┌─────────────────────────────────────────────────────────────┐
│ GENERATE, FROM FOUR CLOCK SIGNALS THAT ARE SUBSTANTIALLY    │
│ PHASE SPACED AT 90 DEGREES, A FIRST SET OF FOUR RAW SELECT  │
│                          SIGNALS                            │
│                            802                              │
└─────────────────────────────────────────────────────────────┘
                              │
┌─────────────────────────────────────────────────────────────┐
│ PRODUCE OVERLAP/UNDERLAP INDICATORS CORRESPONDING TO        │
│ PAIRS OF CONSECUTIVE PHASES OF THE FIRST SET OF FOUR RAW    │
│                    SELECT SIGNALS                           │
│                          804                                │
└─────────────────────────────────────────────────────────────┘
                              │
┌─────────────────────────────────────────────────────────────┐
│ BASED ON THE OVERLAP/UNDERLAP INDICATORS, ADJUST            │
│ RESPECTIVE DUTY CYCLES OF THE FIRST SET OF FOUR SELECT      │
│ SIGNALS TO PRODUCE A SET OF FOUR NONOVERLAPPING SELECT      │
│                        SIGNALS                              │
│                          806                                │
└─────────────────────────────────────────────────────────────┘
                              │
┌─────────────────────────────────────────────────────────────┐
│ BASED ON RESPECTIVELY ACTIVATED ONES OF THE SET OF FOUR     │
│ NONOVERLAPPING SELECT SIGNALS, SELECTING A CORRESPONDING    │
│         ONE OF FOUR INPUT SIGNALS TO BE OUTPUT.             │
│                          808                                │
└─────────────────────────────────────────────────────────────┘
```

*FIG. 8*

SELECT SIGNAL DUTY CYCLE ADJUSTMENT

RELATED APPLICATION(S)

This application claims the benefit of U.S. Provisional Application No. 63/433,066, filed 16 Dec. 2022, the entire contents of which is incorporated herein by reference.

BACKGROUND OF THE INVENTION

In many electronic systems, the duty cycle refers to the percentage of the ratio of a pulse duration, or pulse width to the total period of a waveform. It may be used to represent the time duration of a pulse when it is high. In digital electronics, signals may be used in some waveforms that may be represented by logic 1 and logic 0. In such systems, Logic 1 stands for the presence of an electric pulse and logic 0 stands for the absence of an electric pulse.

SUMMARY

In one or more embodiments of the present disclosure, an integrated circuit is provided. The circuit may include an N-input multiplexor (MUX) including N number of select signals, where N is a positive integer greater than three. The circuit may further include select signal generating circuitry to receive N number of clock signals at a phase spacing substantially at 360 degrees divided by N, and to produce a first set of N number of select signals. The circuit may also include a duty cycle control loop to adjust respective duty cycles of the first set of N number of select signals to produce a second set of N number of select signals to be provided to the N-input MUX.

One or more of the following features may be included. In some embodiments, the duty cycle control loop may include detection circuitry to produce indicators of overlap and underlap of two consecutive phases the first set of N number of select signals. The indicators of overlap and underlap may include at least one of a local maxima and local minima when two of the consecutive phases have maximized pulse width with minimized overlap. The detection circuitry may include an exclusive-OR type function between each of the two consecutive phases of the first set of N number of select signals. The duty cycle control loop may include duty cycle correction circuitry responsive to the indicators of overlap and underlap. N may be equal to four. The select signal generating circuitry may produce a third set of N number of select signals that are complementary to the first set of N number of select signals and the duty cycle control loop may adjust respective duty cycles of the third set of N number of select signals to produce a fourth set of N number of select signals, complementary to the second set of N number of select signals, to be provided to the N-input MUX.

In one or more embodiments of the present disclosure, an integrated circuit is provided. The circuit may include select signal generating circuitry to receive four clock signals respectively, the four clock signals substantially phase spaced at 90-degree intervals, and to produce a first set of four select signals. The circuit may further include duty cycle correction circuitry responsive to a duty cycle control loop to adjust respective duty cycles of the first set of four select signals to produce a second set of four select signals.

One or more of the following features may be included. In some embodiments, the circuit may include a four-input multiplexor (MUX) to receive the second set of four select signals and to, based on respectively activated ones of the second set of four select signals, select a corresponding one of four input signals to be output. The select signal generating circuitry may produce a third set of four select signals that are complementary to the first set of four select signals and the duty cycle correction circuitry, responsive to the duty cycle control loop is to adjust respective duty cycles of the third set of four select signals to produce a fourth set of four select signals that are complementary to the second set of four select signals. The four input MUX may receive the fourth set of four select signals and is to, further based on uniquely activated ones of the fourth set of four select signals, select the corresponding one of four input signals to be output. The duty cycle control loop may include detection circuitry to produce first indicators of overlap and underlap of two consecutive phases of the first set of four select signals and second indicators of overlap and underlap of two consecutive phases of the third set of four select signals. The first indicators of overlap and underlap and the second indicators of overlap and underlap may each have a one of a local maxima and local minima when respective signals of two consecutive phases have maximum pulse width with substantially no overlap. The detection circuitry may include at least one exclusive-OR function between respective signals of two consecutive phases of the first set of four select signals and the second set of four select signals.

In one or more embodiments of the present disclosure, a method of operating an integrated circuit is provided. The method may include generating, from N number of clock signals that are substantially phase spaced at 360 degrees divided by N, a first set of N number of select signals, where N is a positive integer greater than three. The method may further include adjusting, using a first duty cycle control loop, respective duty cycles of the first set of N number of select signals to produce a second set of N number of select signals. Based on respectively activated ones of the second set of N number of select signals, the method may also include selecting a corresponding input signal to be output.

One or more of the following features may be included. In some embodiments, the method may include producing overlap/underlap indicators each corresponding to pairs of consecutive phases of the first set of N number of select signals. The overlap/underlap indicators may include local maximums when the pairs of consecutive phases of the first set of N number of select signals have maximized pulse width with minimized overlap. The method may further include using an exclusive-OR type function to produce overlap/underlap indicators. The method may also include generating a third set of N number of select signals that are complementary to the first set of N number of select signals and adjusting, using a second duty cycle control loop, respective duty cycles of the third set of N number of select signals to produce a fourth set of N number of select signals that are complementary to the second set of select signals. Selecting the corresponding input signal to be output is further based on respectively activated ones of the fourth set of N number of select signals.

BRIEF DESCRIPTION OF THE DRAWINGS

FIG. 7 is a flowchart illustrating a method of operating an integrated circuit.

FIG. 8 is a flowchart illustrating a method of adjusting select signal overlap/underlap.

DETAILED DESCRIPTION OF THE EMBODIMENTS

In an embodiment, an N-input (e.g., 4) multiplexor (MUX) may receive N number of select signals. Select signal generating circuitry may receive N number of clock signals at a phase spacing that is substantially at 360 degrees divided by N (e.g., 90 degrees for N=4). The select signal generating circuitry may produce a coarse set of N number of select signals that may have unequal duty cycles and/or overlap. A duty cycle feedback control loop may be used to adjust respective duty cycles of the coarse select signals to produce select signals that have equal duty cycles and do not overlap. In particular, low pass filters may be used to produce indicators of the duty cycles of each of the select signals. The duty cycles of the signals may be adjusted so that these indicators are all substantially equal. An XOR gate may be used to detect overlap and underlap of successive pairs of select signals. A filtered output of the XOR reaches a peak when overlap/underlap is minimized. While maintaining the substantially equal duty cycles, a feedback control loop may be used to adjust the select signals to the peak thereby substantially minimizing the overlap of the select signals.

Figure 1:
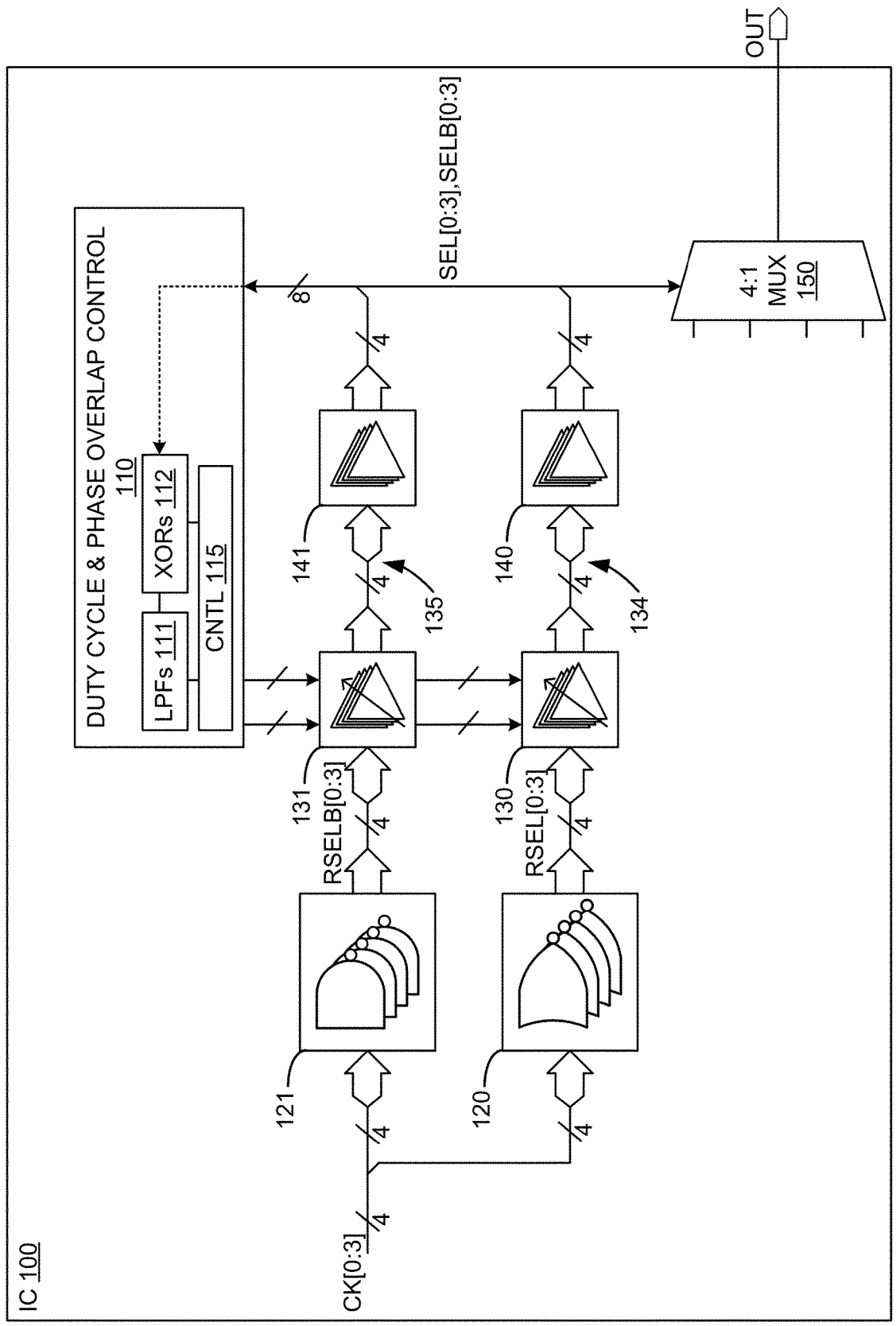
FIG. 1 is a block diagram of an integrated circuit with duty cycle adjustment.

FIG. 1 is a block diagram of an integrated circuit with duty cycle adjustment. In FIG. 1, integrated circuit 100 comprises duty cycle and phase overlap control circuitry 110, four 2-input NOR gate bank 120, four 2-input NAND gate bank 121, four duty cycle correction circuits 130, four duty cycle correction circuits 131, bank of four buffers 140, bank of four buffers 141, and 4:1 multiplexor (MUX) 150. Control circuitry 110 includes low-pass filter circuitry 111, XOR circuitry 112, and control circuitry 115.

Figure 2:
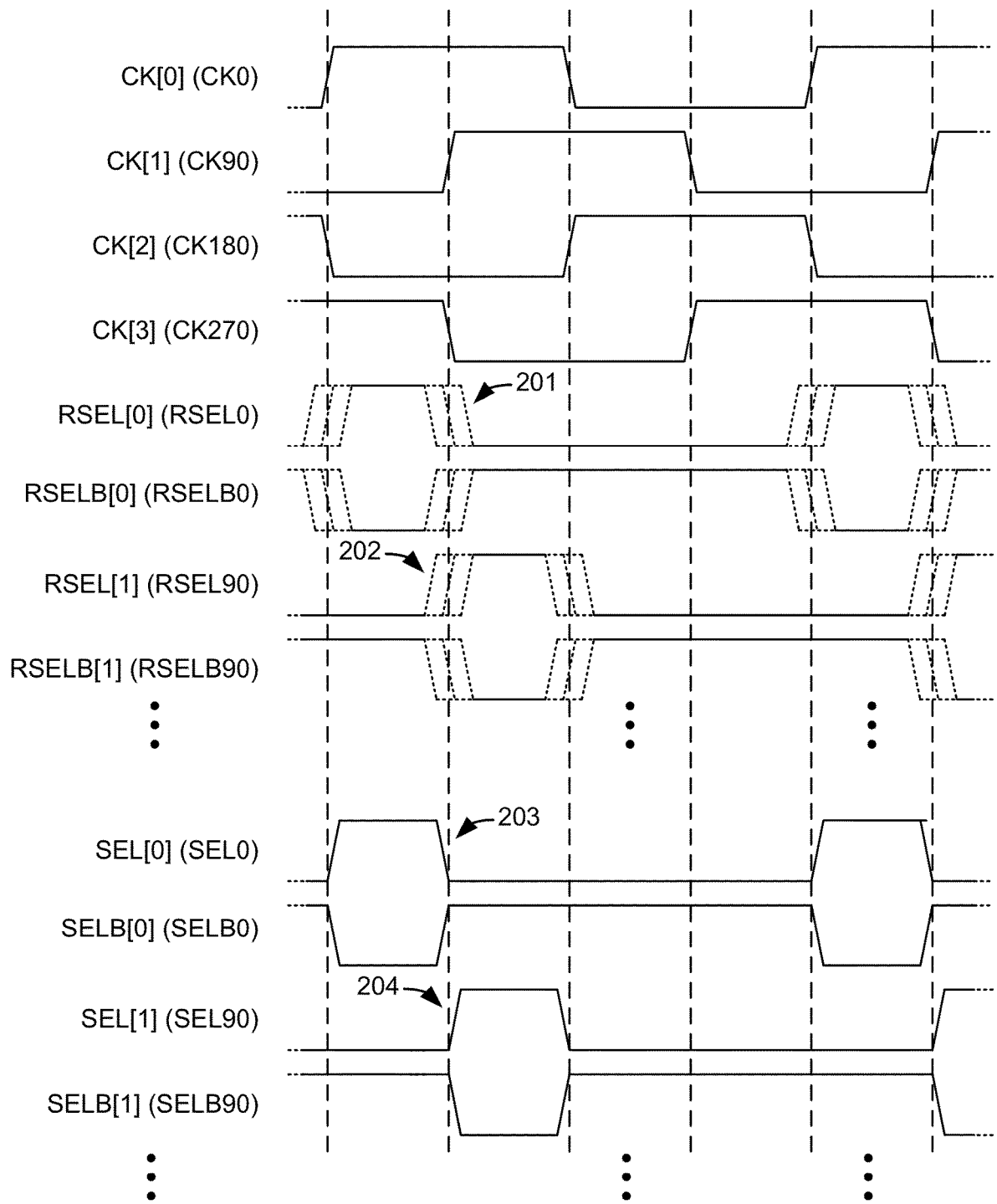
FIG. 2 is a timing diagram illustrating select signal adjustment.

In some embodiments, NOR gate bank 120 and NAND gate bank 121 each receive four clock signals (CK [0:3]) that are successively phased spaced by 90°. This is illustrated in FIG. 2 by the waveforms for CK [0] (a.k.a., CK0), CK [1] (a.k.a., CK90), CK [2] (a.k.a., CK180), and CK [3] (a.k.a., CK270). Each of the four NOR gates of NOR gate bank 120 may perform a logical NOR operation on each pair of successive 90° phase-spaced waveforms to produce a raw (i.e., coarse or not duty cycle or overlap corrected) positive true select signal (RSEL[0:3]). Similarly, each of the four NAND gates of NAND gate bank 121 performs a logical NAND operation on each pair of successive 90° phase-spaced waveforms to produce a raw (i.e., coarse or not duty cycle or overlap corrected) negative true select signal (RSELB[0:3]). Table 1 summarizes example clock signal pairings to NAND and NOR operation to raw select signal output.

TABLE 1

| 3]&CK[0]) =RSELB[0]\x \to(CK[ | =RSEL[0] \x \to(CK[1]|CK[2]) |
| 0]&CK[1]) =RSELB[1]\x \to(CK[ | =RSEL[1]\x \to(CK[2]|CK[3]) |
| 1]&CK[2]) =RSELB[2]\x \to(CK[ | =RSEL[2]\x \to(CK[3]|CK[0]) |
| =RSELB[3]\x \to(CK[2]&CK[3]) | =RSEL[3] \x \to(CK[0]|CK[1]) |

The raw select signal waveforms are illustrated by example in FIG. 2 by RSEL[0], RSEL[1], RSELB[0], and RSELB[1]. Note the possibility of unequal duty cycles and possible select signal overlap illustrated by the dotted lines in the waveforms (e.g., dotted lines 201 and dotted lines 202).

In some embodiments, the raw select signals RSEL[0:3] may each be input to respective duty cycle correction circuits 130. The raw select signals RSELB[0:3] may each be input to respective duty cycle correction circuits 131. The outputs 134 of duty cycle correction circuits 130 are buffered by buffers 140. The outputs 135 of duty cycle correction circuits 131 are buffered by buffers 141. The outputs SEL [0:3] of buffers 140 are provided to MUX 150 and control circuitry 110. The outputs SELB [0:3] of buffers 141 are provided to MUX 150 and control circuitry 110.

In some embodiments, control circuitry 110 may control duty cycle correction circuitry 130 and duty cycle correction circuitry 131 to equalize the duty cycles of select signals SEL[0:3] and to equalize the duty cycles of select signals SELB [0:3]. Because control circuitry 110 controls duty cycle correction circuitry 130 and duty cycle correction circuitry 131, and also receives SEL[0:3] and SELB [0:3], it should be understood that duty cycle correction circuitry 130, duty cycle correction circuitry 131, buffers 140, buffers 141, and control circuitry 110 form feedback control loops for each select signal SEL[0:3] and SELB [0:3]. These feedback control loops function to equalize the duty cycles of SEL[0:3] and SELB [0:3], respectively, and to minimize or eliminate overlap between SEL[0:3] and SELB [0:3], respectively (or at least keep any overlap below a transistor turn-on threshold voltage) thereby preventing drive fights between the inputs to MUX 150. This is illustrated by example in FIG. 2 by SEL[0], SEL[1], SELB [0], and SELB [1] which are shown with SEL[0] not overlapping SEL[1] and SELB [0] not overlapping SELB [1].

Figure 3A:
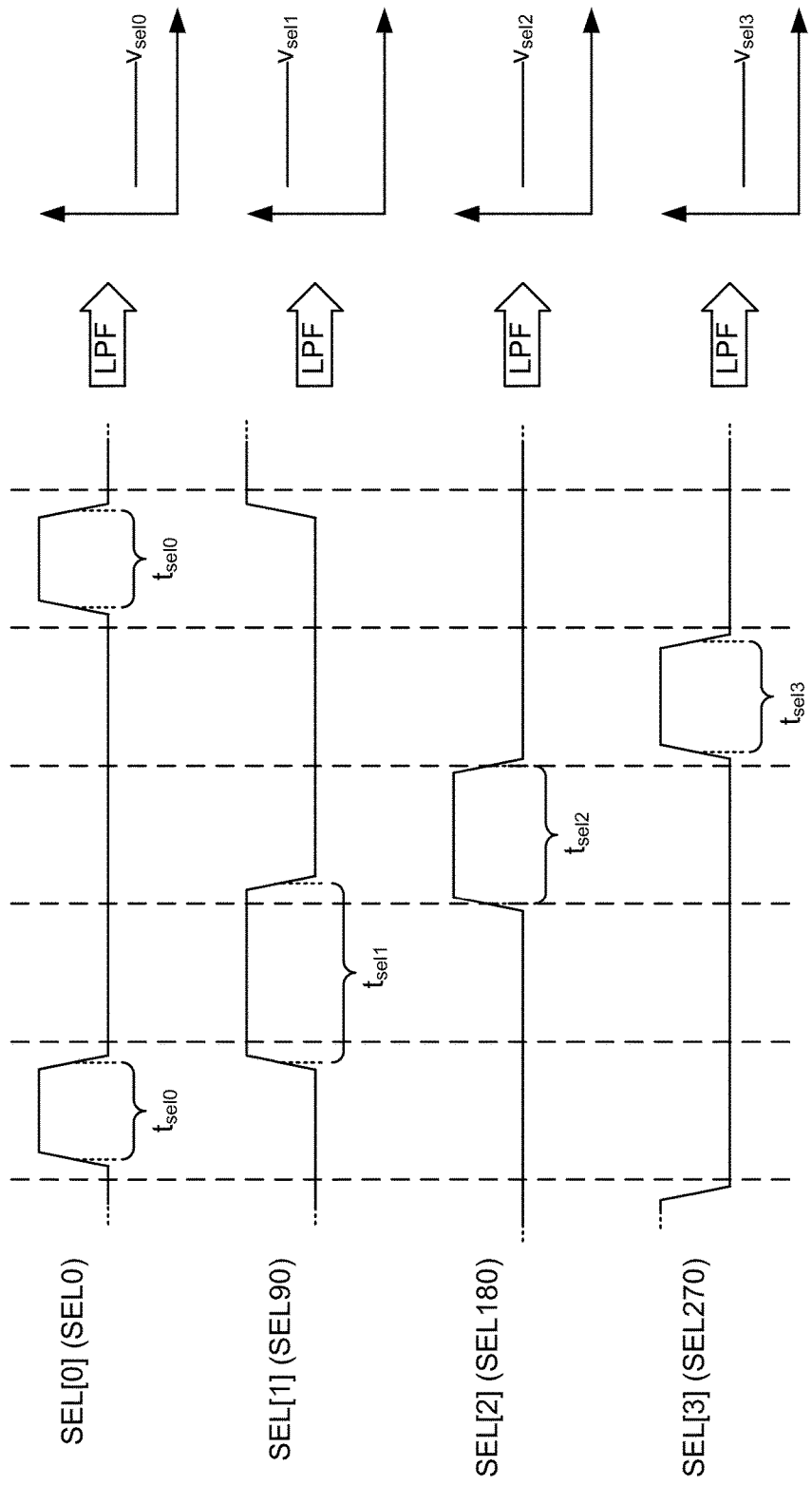
FIGS. 3A-3B are diagrams illustrating adjusting duty cycle indicators.
Figure 3B:
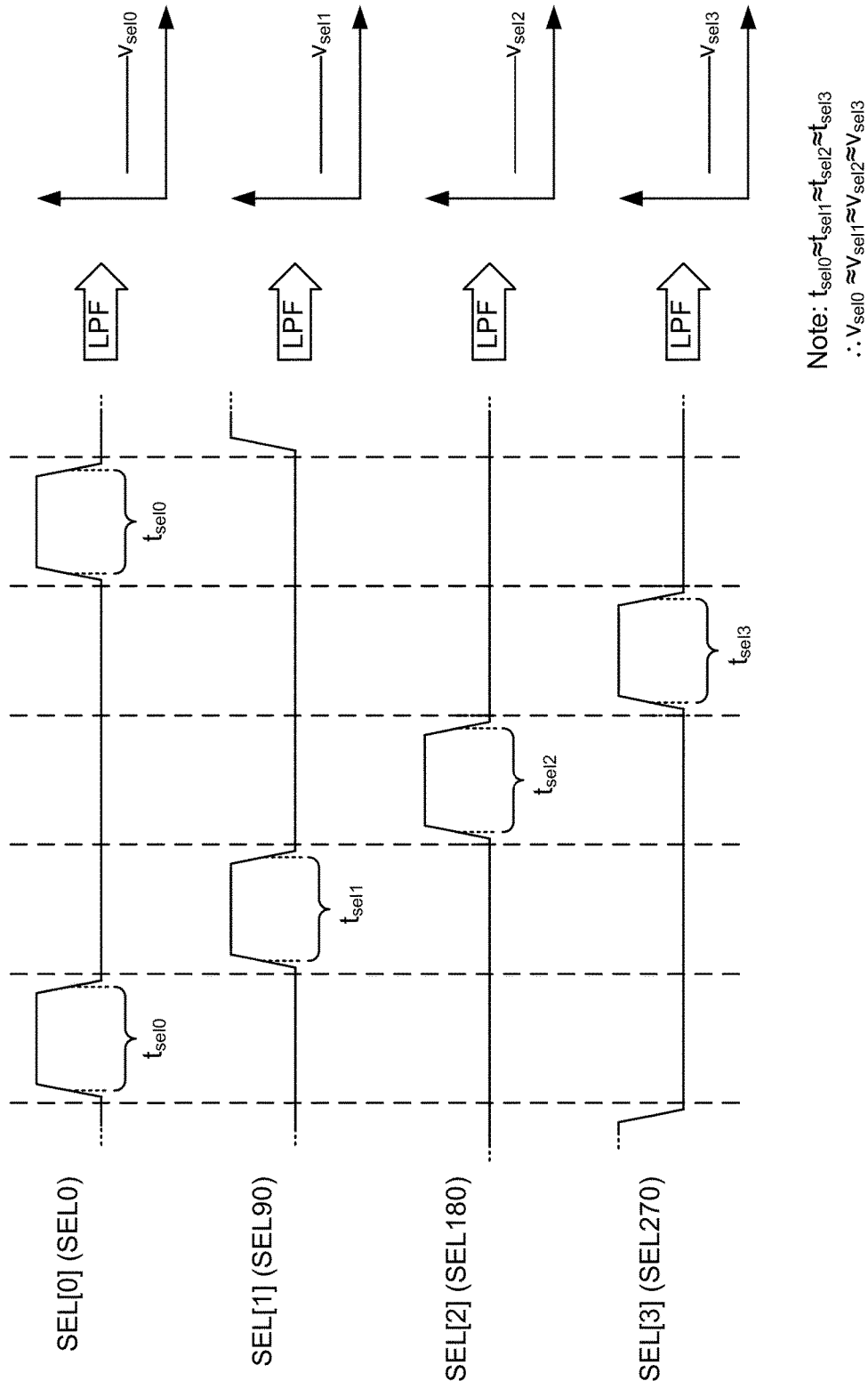

As discussed herein and illustrated in FIG. 2, raw select signals RSEL[0:3] may have unequal duty cycles. Similarly, raw select signal RSELB[0:3] may have unequal duty cycles. Control circuitry 110 detects the unequal duty cycles of RSEL[0:3] and the unequal duty cycles of RSELB[0:3] (as manifested on SEL[0:3] and SELB [0:3]) and controls duty cycle correction circuitry 130 and duty cycle correction circuitry 131 to equalize the duty cycles of SEL[0:3] and SELB [0:3]. This is illustrated by FIGS. 3A-3B with reference to select signal SEL[0:3]. Similar feedback and correction may be performed by control circuitry 110 with respect to SELB [0:3].

In FIG. 3A, the duty cycles of SEL[0:3] are each different with SEL[0] being active for $t_{sel0}$, SEL[1] being active for $t_{sel1}$, SEL[2] being active for $t_{sel2}$, and SEL[3] being active for $t_{sel3}$. In FIG. 3A, $t_{sel0} \neq t_{sel1} \neq t_{sel2} \neq t_{sel3}$. Control circuitry 110 low-pass filters each of SEL[0:3] (e.g., using LPF circuitry 111) to produce respective voltages indicative of the duty cycle of each of SEL[0:3]. This is illustrated in FIG. 3A by the arrows with "LPF" pointing from respective SEL[0:3] waveforms to a voltage sketch showing the output of the low-=pass filtering for each of SEL[0:3]. Note that since $t_{sel0} \neq t_{sel1} \neq t_{sel2} \neq t_{sel3}$, $V_{sel0} \neq V_{sel1} \neq V_{sel2} \neq V_{sel3}$.

Accordingly, control circuitry 110 may control duty cycle correction circuitry 130 and duty cycle correction circuitry 131 to equalize the duty cycles of SEL[0:3] and SELB [0:3], respectively. This is illustrated in FIG. 3B by $t_{sel0} \approx t_{sel1} \approx t_{sel2} \approx t_{sel3}$ which results in $v_{sel0} \approx v_{sel1} \approx v_{sel2} \approx v_{sel3}$.

Figure 4A:
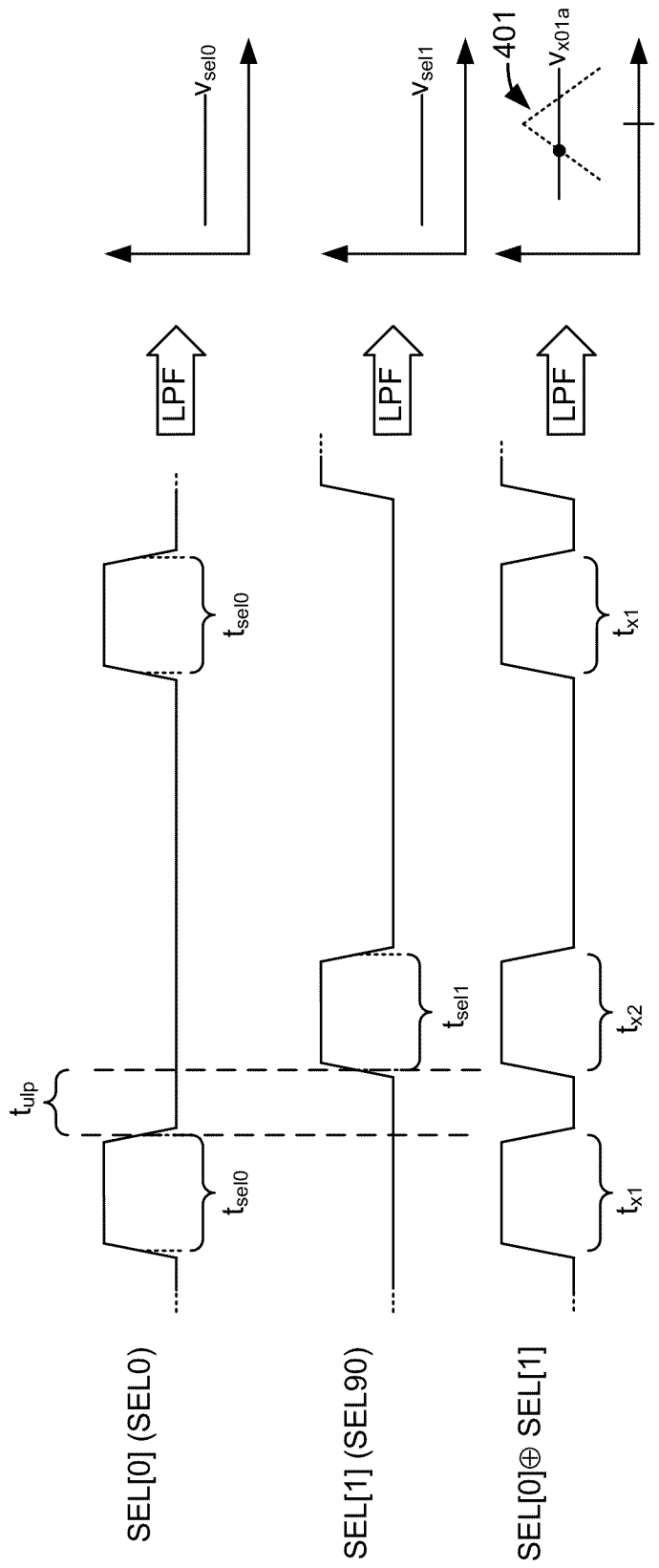
FIGS. 4A-4C are diagrams illustrating overlap detection and optimization.

As discussed herein and illustrated in FIG. 2, the signals of one or more pairs of successive 90° phase-spaced waveforms raw select signals RSEL[0:3] may overlap or underlap. Similarly, the signals of one or more pairs of successive 90° phase-spaced waveforms raw select signals RSELB[0:3] may overlap or underlap. Underlap is illustrated by example in FIG. 4A by the falling edge of SEL[0] and the rising edge of SEL[1] being spaced by an underlap period of time-$t_{ulp}$. Also shown in FIG. 4A is a waveform of the exclusive-OR of SEL[0] and SEL[1], and the low-pass filtering of the XOR (e.g., by XOR circuitry 112) resulting in a first voltage $V_{x01a}$. On the plot of VX01a an inverted "V" dotted line 401 is illustrated. Dotted line 401 illustrates a curve relating the LPF output of SEL[0] XOR's with SEL[1] moving from underlap on the left leg of the "V" to overlap on the right leg of the "V". The dot on the plot represents where the first voltage Vxola lies on this curve for the underlap illustrated in FIG. 4A.

Figure 4B:
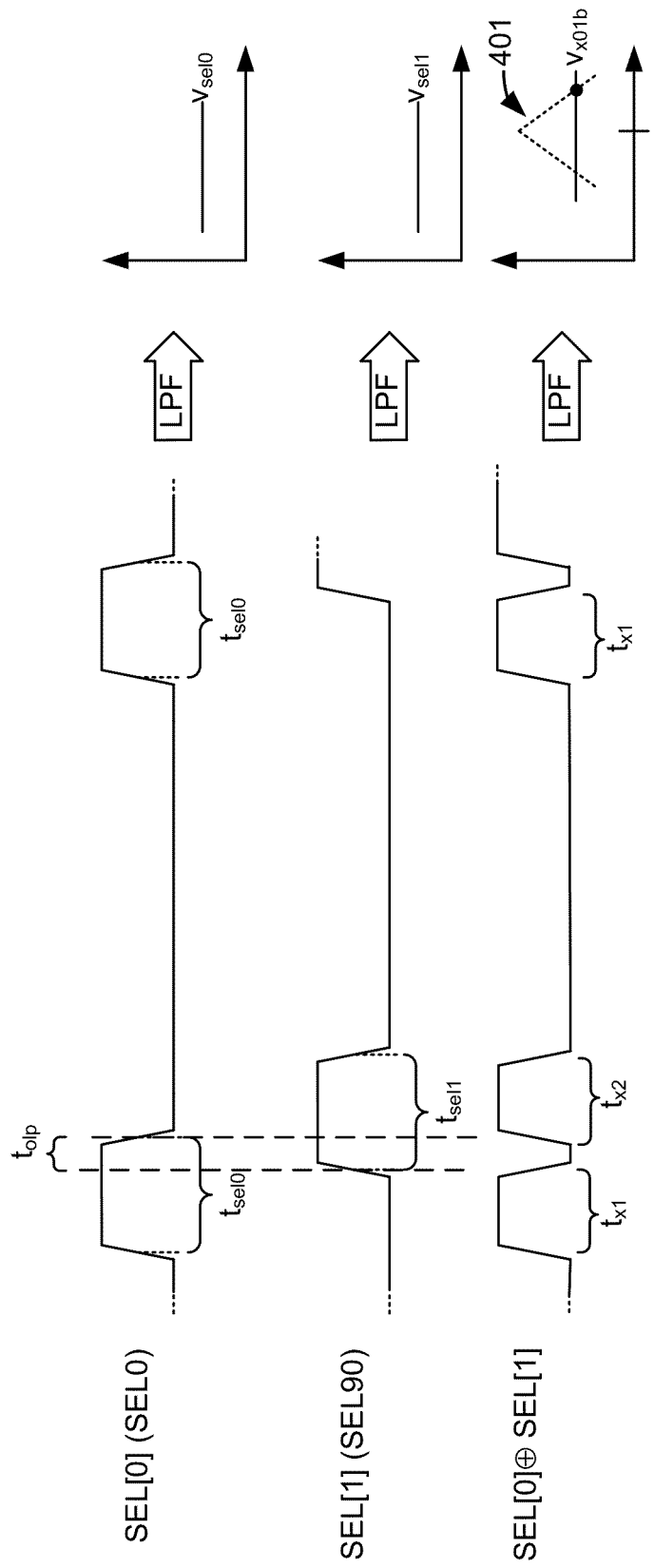

Overlap is illustrated by example in FIG. 4B by the falling edge of SEL[0] and the rising edge of SEL[1] being spaced by an overlap period of time-tolp. Also shown in FIG. 4B is a waveform of the exclusive-OR of SEL[0] and SEL[1], and the low-pass filtering of the XOR resulting in a second voltage $V_{x01b}$. The dot on the plot represents where the second voltage Vxolb lies on the curve illustrated by dotted line 401 for the overlap illustrated in FIG. 4B.

Figure 4C:
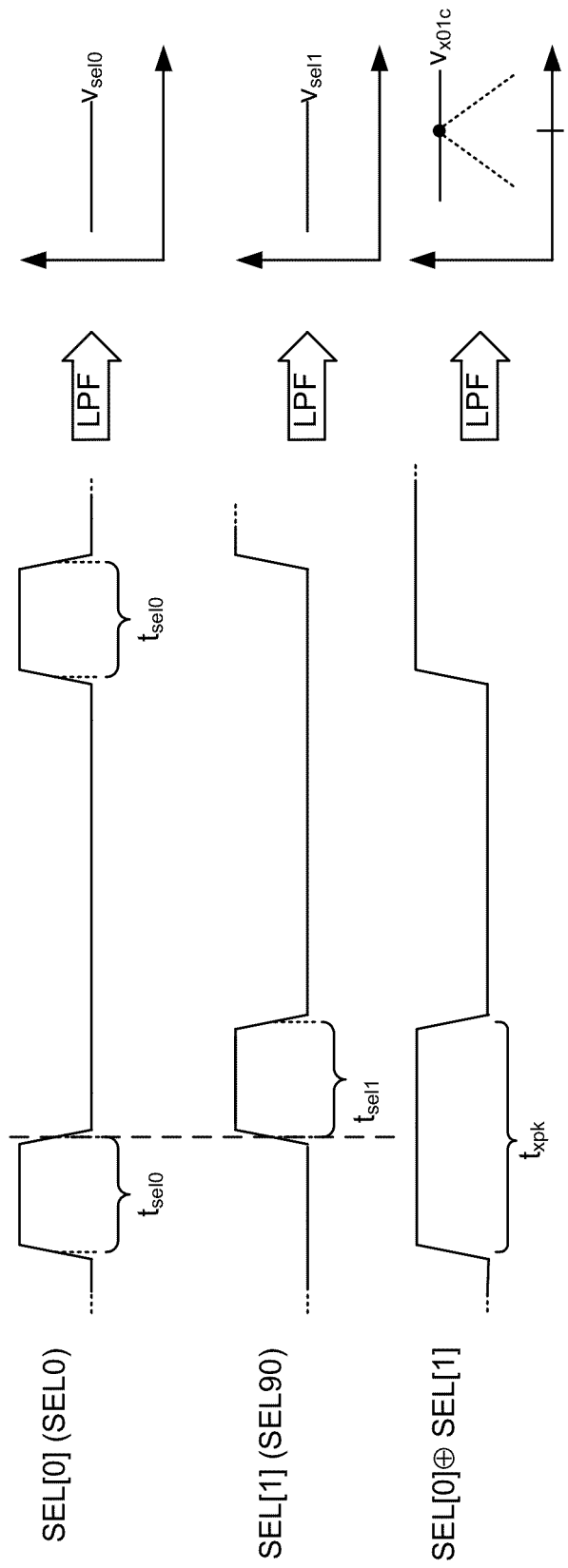

Accordingly, for each pair of successive select signals SEL[0:3] and SELB [0:3] (represented by example in FIGS. 4A-4C by SEL[0] and SEL[1]), control circuitry 110 controls duty cycle correction circuitry 130 and duty cycle correction circuitry 131 to respectively maximize the low-pass filtered output of the XOR of respective successive select signals SEL[0:3] and SELB [0:3]. This is illustrated in FIG. 4C by the falling edge of SEL[0] and the rising edge of SEL[1] occurring at substantially the same time. Also shown in FIG. 4C is a waveform of the exclusive-OR of SEL[0] and SEL[1], and the low-pass filtering of the XOR resulting in a third voltage $V_{x01c}$. The dot on the plot represents that the third voltage $V_{x01c}$ lies at the peak of the curve illustrated by dotted line 401 indicating minimized or substantially eliminated overlap/underlap.

Note that the edges being adjusted are those edges of SEL[0:3] and SELB [0:3] that should be switching at the same time but without overlap or underlap. Thus, for example, when calibrating the successive select signals SEL[0] in relation to SEL[1], the falling edge of SEL[0] and/or the rising edge of SEL[1] will be adjusted relative to each other. In addition to calibrating each select signal SEL[0:3] and SELB [0:3] relative to the successive select signal SEL[0:3] and SELB [0:3], each select signal SEL[0:3] and SELB [0:3] is calibrated to minimize overlap/underlap with respect to its complement. In other words, SEL[0] and SELB [0] are also calibrated to minimize overlap/underlap with respect to each other, SEL[1] and SELB [1] are also calibrated to minimize overlap/underlap with respect to each other, and so on for each select signal SEL[0:3] and its respective complement SELB [0:3].

After control circuitry 110 controls duty cycle correction circuitry 130 and duty cycle correction circuitry 131 to respectively maximize the low-pass filtered output of the XOR of respective successive select signals SEL[0:3] and SELB [0:3] (i.e., adjusting for the maxima which minimizes overlap/underlap and maximizes pulse width) non-idealities of one or more of duty cycle correction circuitry 130 and duty cycle correction circuitry 131 may result in the duty cycles of SEL[0:3] and SELB [0:3] being unequal (again). Thus, control circuitry 110 may iterate between adjusting the duty cycles of SEL[0:3] and SELB [0:3] and minimizing overlap/underlap. In an embodiment, control circuitry 110 may iterate between adjusting the duty cycles of SEL[0:3] and SELB [0:3] and minimizing overlap/underlap for a fixed number of iterations. In another embodiment, control circuitry 110 may iterate between adjusting the duty cycles of SEL[0:3] and SELB [0:3] and minimizing overlap/underlap until a threshold condition is met (e.g., the difference between LPF outputs below the resolution of the analog-to-digital converters that measure LPF outputs, or the difference between LPF outputs is less than a selected amount).

FIGS. 1-4C and associated discussions are made with reference to four select signals SEL[0:3] and their complements SELB [0:3]. However, it should be understood that the circuitry functions, control feedback loops, etc., may be extended to an arbitrary number (e.g., N) of select signals and MUX inputs. Such an example integrated circuit is illustrated in FIG. 5.

Figure 5:
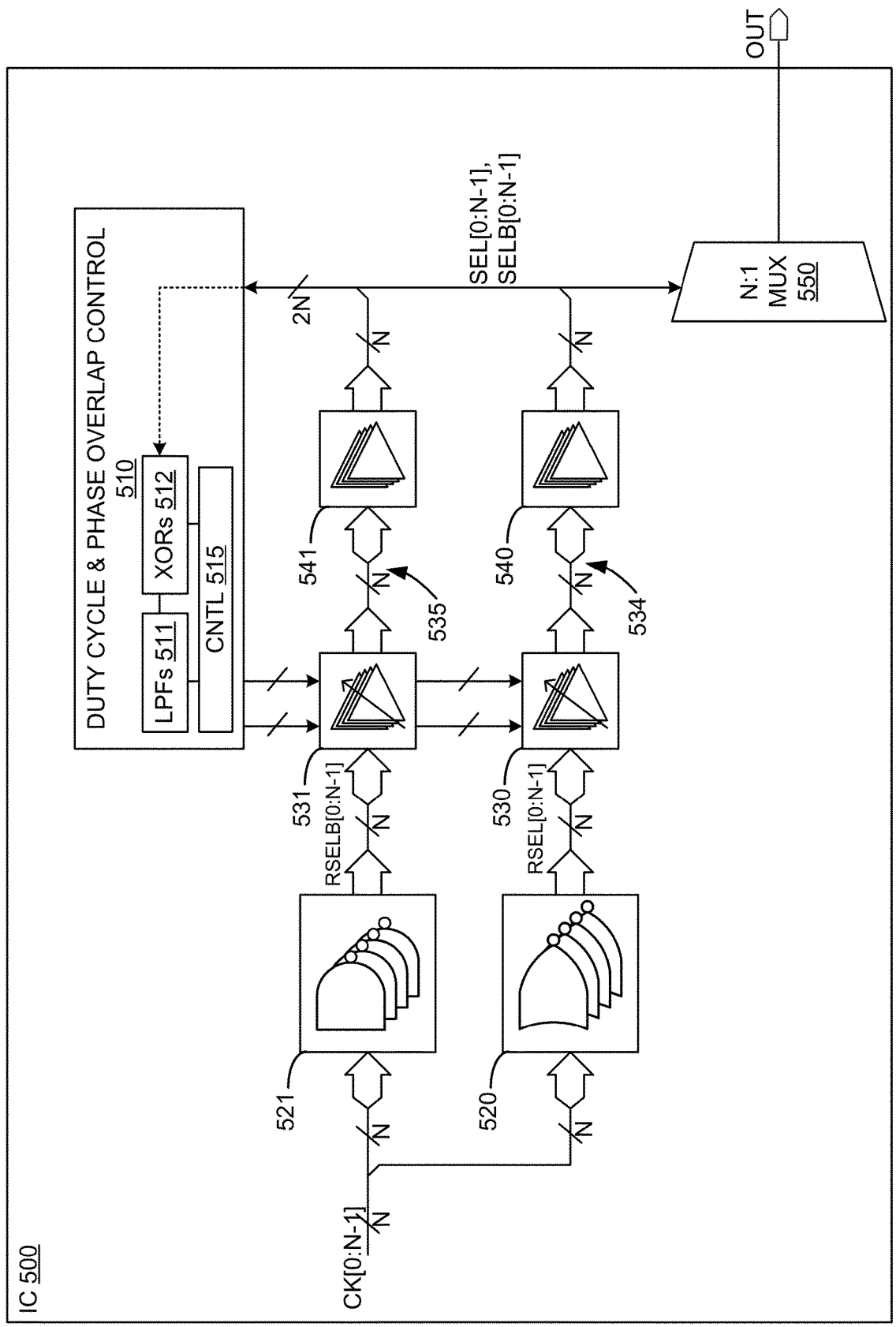
FIG. 5 is a block diagram of an integrated circuit with duty cycle adjustment.

FIG. 5 is a block diagram of an integrated circuit with duty cycle adjustment. In FIG. 5, integrated circuit 500 comprises duty cycle and phase overlap control circuitry 510, N 2-input NOR gate bank 520, N 2-input NAND gate bank 521, N duty cycle correction circuits 130, N duty cycle correction circuits 531, N buffer bank 540, N buffer bank 541, and N:1 multiplexor (MUX) 550. Control circuitry 510 includes low-pass filter circuitry 511, XOR circuitry 512, and control circuitry 515.

Figure 6:
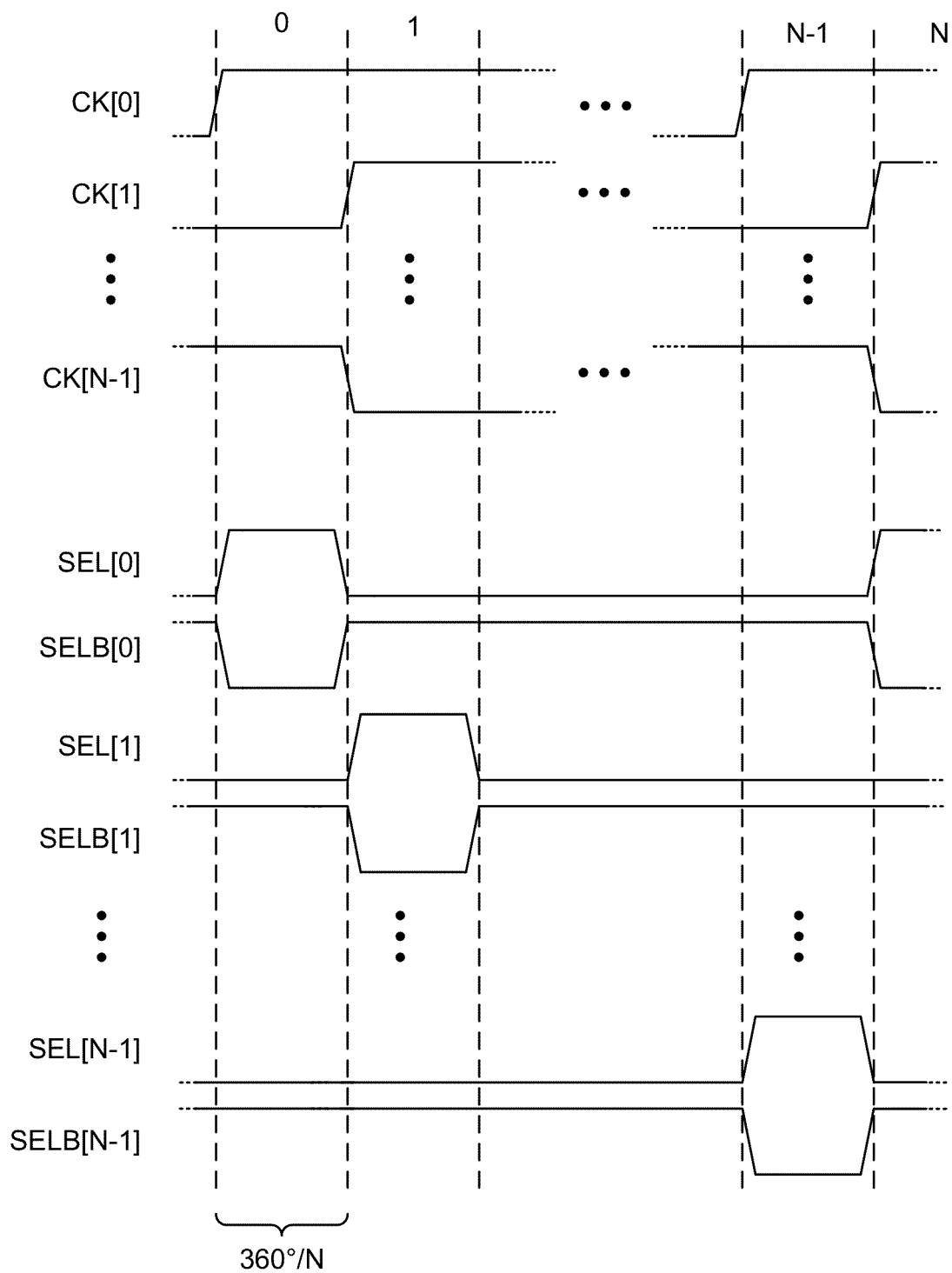
FIG. 6 is a timing diagram illustrating select signal adjustment.

In some embodiments, NOR gate bank 520 and NAND gate bank 521 may each receive N number of clock signals (CK [0:N−1]) that are successively phased spaced by 360°/N. This is illustrated in FIG. 6 by the waveforms for CK [0], CK [1], and CK [N−1]. Each of the N NOR gates of NOR gate bank 520 performs a logical NOR operation on each pair of successive 360°/N phase-spaced waveforms to produce a raw (i.e., coarse or not duty cycle or overlap corrected) positive true select signal (RSEL[0:N−1]). Similarly, each of the four NAND gates of NAND gate bank 521 performs a logical NAND operation on each pair of successive 360°/N phase-spaced waveforms to produce a raw (i.e., coarse or not duty cycle or overlap corrected) negative true select signal (RSELB[0:N−1]). Table 2 summarizes example clock signal pairings to NAND and NOR operation to raw select signal output.

TABLE 2

| | |
|---|---|
| =RSELB[0]\x \to(CK[N/2+1]&CK[0]) | =RSEL[0]\x \to(CK[N/2]\|CK[1]) |
| =RSELB[1]\x \to(CK[N/2+2]&CK[1]) | =RSEL[1]\x \to(CK[N/2+1]\|CK[2]) |
| =RSELB[2]\x \to(CK[N/2+3]&CK[2]) | =RSEL[2]\x \to(CK[N/2+2]\|CK[3]) |
| ... | ... |
| =RSELB[N/2−2]\x \to(CK[N−1]&CK[N/2−2]) | =RSEL[N/2−1]\x \to(CK[N−1]\|CK[N/2]) |
| =RSELB[N/2]\x \to(CK[0]&CK[N/2]) | =RSEL[N/2]\x \to(CK[0]\|CK[N/2+1]) |
| ... | ... |
| =RSELB[N−2]\x \to(CK[N/2−1]&CK[N−2]) | =RSEL[N−2]\x \to(CK[N/2−2]\|CK[N−1]) |
| =RSELB[N−1]\x \to(CK[N/2]&CK[N−1]) | =RSEL[N−1]\x \to(CK[N/2−1]\|CK[0]) |

In some embodiments, the raw select signals RSEL[0:N-1] may each be input to respective duty cycle correction circuits 530. The raw select signals RSELB[0:N-1] may each be input to respective duty cycle correction circuits 531. The outputs 534 of duty cycle correction circuits 530 may be buffered by buffer bank 540. The outputs 535 of duty cycle correction circuits 531 may be buffered by buffer bank 541. The outputs SEL[0:N-1] of N buffer bank 540 may be provided to MUX 550 and control circuitry 510. The outputs SELB [0:N-1] of buffers 141 may be provided to MUX 550 and control circuitry 510.

In some embodiments, control circuitry 510 may control duty cycle correction circuitry 530 and duty cycle correction circuitry 531 to equalize the duty cycles of select signals SEL[0:N-1] and to equalize the duty cycles of select signals SELB [0:N-1]. Also, for each pair of successive select signals SEL[0:N-1] and SELB [0:N-1] control circuitry 510 may control duty cycle correction circuitry 530 and duty cycle correction circuitry 531 to respectively maximize the low-pass filtered output of the XOR of respective successive select signals SEL[0:N-1] and SELB [0:N-1]. Thus, it should be understood that the discussions relating to FIGS. 1-4C are equivalent to the case where N=4. Accordingly, for the sake of brevity, the operations and functioning of integrated will not be repeated here.

FIG. 7 is a flowchart illustrating a method of operating an integrated circuit. One or more of the steps illustrated in FIG. 7 may be performed by, for example, integrated circuit 100, integrated circuit 500, and/or their components. From N number of clock signals that are substantially phase spaced at 360 degrees divided by N, a first set of N number of select signals is generated, where N is a positive integer greater than three (702). For example, from clock signals CK [0:N-1], NOR gate bank 520 may generate N number of raw select signals RSEL[0:N-1]. In another example, from clock signals CK [0:N-1], NAND gate bank 521 may generate N number of raw select signals RSELB[0:N-1].

In some embodiments, using a first duty cycle control loop, respective duty cycles of the first set of N number of selects signals may be adjusted to produce a second set of N number of select signals (704). For example, using a duty cycle control loop comprised of control circuitry 510 and duty cycle correction circuitry 530, control circuitry 510 may adjust duty cycle correction circuitry 530 to produce, from raw select signals RSEL[0:N-1], select signals SEL [0:N-1] that have equal duty cycles and substantially no overlap or underlap. In another example, using a duty cycle control loop comprised of control circuitry 510 and duty cycle control circuitry 531, control circuitry 510 may adjust duty cycle correction circuitry 531 to produce, from raw select signals RSELB[0:N-1], select signals SELB [0:N-1] that have equal duty cycles and substantially no overlap or underlap.

In some embodiments, based on respectively activated ones of the second set of N number of select signals, a corresponding input signal may be selected to be output (706). For example, based on only one of select signals SEL[0:N-1] being activated (e.g., SEL[0]), and a corresponding one of complementary select signals SELB [0:N-1] (e.g., SELB [0]), MUX 550 may select a one of its inputs to be output from integrated circuit 500.

FIG. 8 is a flowchart illustrating a method of adjusting select signal overlap/underlap. One or more of the steps illustrated in FIG. 8 may be performed by, for example, integrated circuit 100, integrated circuit 500, and/or their components. From four clock signals that are substantially phase spaced at 90 degrees, a first set of four raw select signals is generated (802). For example, from clock signals CK [0:3], NOR gate bank 120 may raw select signals RSEL[0:3]. In another example, from clock signals CK [0:3], NAND gate bank 121 may generate raw select signals RSELB[0:3].

In some embodiments, overlap/underlap indicators corresponding to pairs of consecutive phases of the first set of four raw select signals may be produced (804). For example, overlap/underlap indicator voltages may be produced by control circuitry 110 based on the XOR of pairs of consecutive phases of select signals SEL[0:3] which are based on corresponding consecutive phases of raw select signals RSEL[0:3]. In another example, overlap/underlap indicator voltages may be produced by control circuitry 110 based on the XOR of pairs of consecutive phases of select signals SEL[0:3] which are based on corresponding consecutive phases of raw select signals RSEL[0:3].

In some embodiments, based on the overlap/underlap indicators, respective duty cycles of the first set of four select signals may be adjusted to produce a set of four nonoverlapping select signals (806). For example, based on a low-pass filtered version of the XOR of pairs of consecutive phases of select signals SEL[0:3], control circuitry 110 may control duty cycle correction circuitry to maximize the low-pass filtered outputs of respective XOR functions of pairs of consecutive phases of select signals SEL[0:3]. In another example based on a low-pass filtered version of the XOR of pairs of consecutive phases of select signals SELB [0:3], control circuitry 110 may control duty cycle correction circuitry to maximize the low-pass filtered outputs of respective XOR functions of pairs of consecutive phases of select signals SELB [0:3].

In some embodiments, based on respectively activated ones of the set of four nonoverlapping select signals, a corresponding one of fours input signals may be selected to be output (706). For example, based on only one of nonoverlapping select signals SEL[0:N-1] being activated (e.g., SEL[0]), and a corresponding one of nonoverlapping complementary select signals SELB [0:N-1] (e.g., SELB [0]), MUX 150 may select a one of its four inputs to be output from integrated circuit 500.

The methods, systems and devices described above may be implemented in computer systems or stored by computer systems. The methods described above may also be stored on a non-transitory computer readable medium. Devices, circuits, and systems described herein may be implemented using computer-aided design tools available in the art and embodied by computer-readable files containing software descriptions of such circuits. This includes, but is not limited to, one or more elements of integrated circuit 100, integrated circuit 500, and their components. These software descriptions may be: behavioral, register transfer, logic component, transistor, and layout geometry-level descriptions. Moreover, the software descriptions may be stored on storage media or communicated by carrier waves.

Data formats in which such descriptions may be implemented include, but are not limited to, formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

Figure 9:
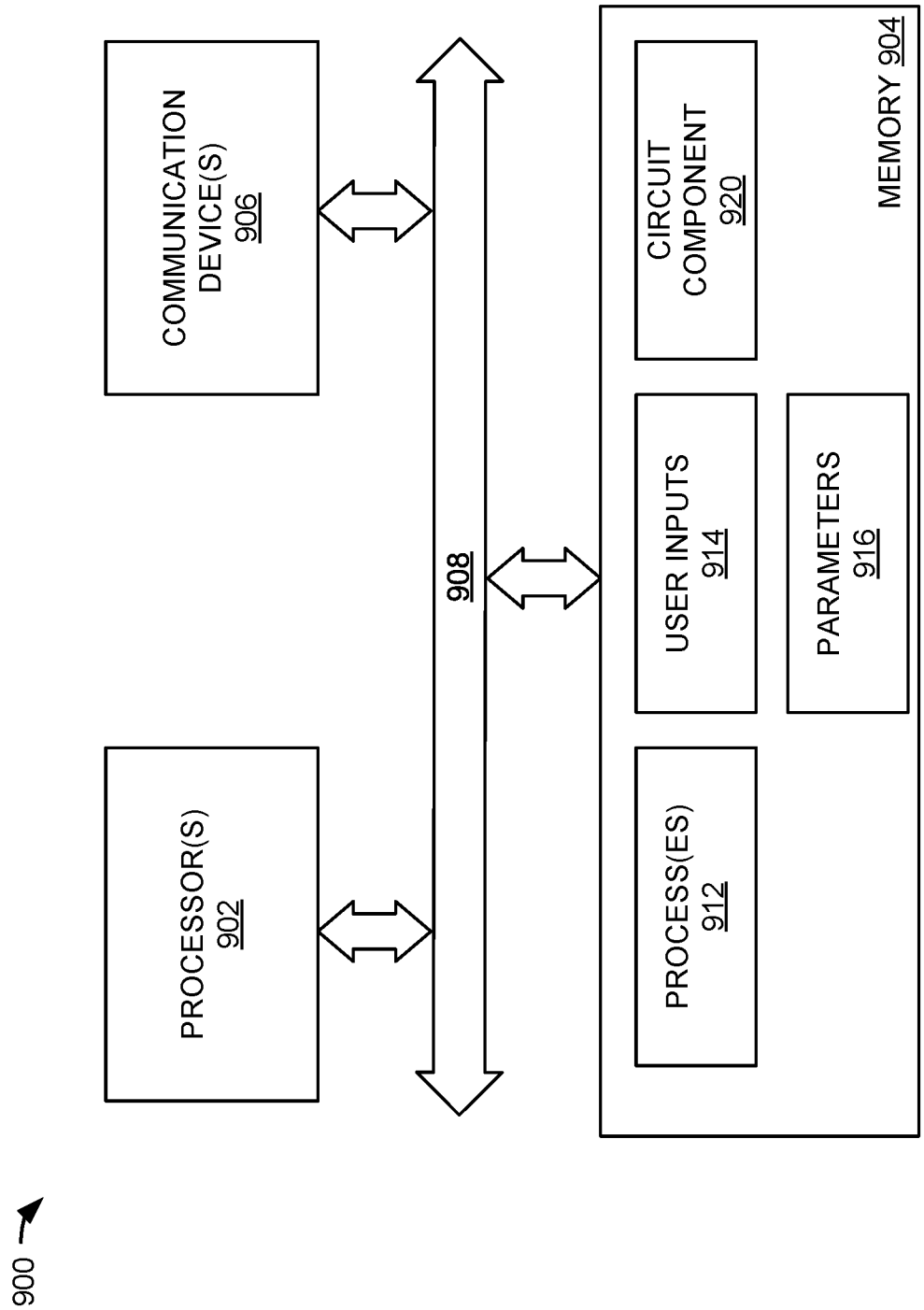
FIG. 9 is a block diagram of a processing system.

FIG. 9 is a block diagram illustrating one embodiment of a processing system 900 for including, processing, or generating, a representation of a circuit component 920. Processing system 900 includes one or more processors 902, a memory 904, and one or more communications devices 906. Processors 902, memory 904, and communications devices 906 communicate using any suitable type, number, and/or configuration of wired and/or wireless connections 908.

Processors 902 execute instructions of one or more processes 912 stored in a memory 904 to process and/or generate circuit component 920 responsive to user inputs 914 and parameters 916. Processes 912 may be any suitable electronic design automation (EDA) tool or portion thereof used to design, simulate, analyze, and/or verify electronic circuitry and/or generate photomasks for electronic circuitry. Representation 920 includes data that describes all or portions of integrated circuit 100, integrated circuit 500, and their components, as shown in the Figures.

Representation 920 may include one or more of behavioral, register transfer, logic component, transistor, and layout geometry-level descriptions. Moreover, representation 920 may be stored on storage media or communicated by carrier waves.

Data formats in which representation 920 may be implemented include, but are not limited to, formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email.

User inputs 914 may comprise input parameters from a keyboard, mouse, voice recognition interface, microphone and speakers, graphical display, touch screen, or other type of user interface device. This user interface may be distributed among multiple interface devices. Parameters 916 may include specifications and/or characteristics that are input to help define representation 920. For example, parameters 916 may include information that defines device types (e.g., NFET, PFET, etc.), topology (e.g., block diagrams, circuit descriptions, schematics, etc.), and/or device descriptions (e.g., device properties, device dimensions, power supply voltages, simulation temperatures, simulation models, etc.).

Memory 904 includes any suitable type, number, and/or configuration of non-transitory computer-readable storage media that stores processes 912, user inputs 914, parameters 916, and circuit component 920.

Communications devices 906 include any suitable type, number, and/or configuration of wired and/or wireless devices that transmit information from processing system 900 to another processing or storage system (not shown) and/or receive information from another processing or storage system (not shown). For example, communications devices 906 may transmit circuit component 920 to another system. Communications devices 906 may receive processes 912, user inputs 914, parameters 916, and/or circuit component 920 and cause processes 912, user inputs 914, parameters 916, and/or circuit component 920 to be stored in memory 904.

In one or more embodiments of the present disclosure, an integrated circuit is provided. The circuit may include an N-input multiplexor (MUX) including N number of select signals, where N is a positive integer greater than three. The circuit may further include select signal generating circuitry to receive N number of clock signals at a phase spacing substantially at 360 degrees divided by N, and to produce a first set of N number of select signals. The circuit may also include a duty cycle control loop to adjust respective duty cycles of the first set of N number of select signals to produce a second set of N number of select signals to be provided to the N-input MUX.

One or more of the following features may be included. In some embodiments, the duty cycle control loop may include detection circuitry to produce indicators of overlap and underlap of two consecutive phases the first set of N number of select signals. The indicators of overlap and underlap may include at least one of a local maxima and local minima when two of the consecutive phases have maximized pulse width with minimized overlap. The detection circuitry may include an exclusive-OR type function between each of the two consecutive phases of the first set of N number of select signals. The duty cycle control loop may include duty cycle correction circuitry responsive to the indicators of overlap and underlap. N may be equal to four. The select signal generating circuitry may produce a third set of N number of select signals that are complementary to the first set of N number of select signals and the duty cycle control loop may adjust respective duty cycles of the third set of N number of select signals to produce a fourth set of N number of select signals, complementary to the second set of N number of select signals, to be provided to the N-input MUX.

In one or more embodiments of the present disclosure, an integrated circuit is provided. The circuit may include select signal generating circuitry to receive four clock signals respectively, the four clock signals substantially phase spaced at 90-degree intervals, and to produce a first set of four select signals. The circuit may further include duty cycle correction circuitry responsive to a duty cycle control loop to adjust respective duty cycles of the first set of four select signals to produce a second set of four select signals.

One or more of the following features may be included. In some embodiments, the circuit may include a four-input multiplexor (MUX) to receive the second set of four select signals and to, based on respectively activated ones of the second set of four select signals, select a corresponding one of four input signals to be output. The select signal generating circuitry may produce a third set of four select signals that are complementary to the first set of four select signals and the duty cycle correction circuitry, responsive to the duty cycle control loop is to adjust respective duty cycles of the third set of four select signals to produce a fourth set of four select signals that are complementary to the second set of four select signals. The four input MUX may receive the fourth set of four select signals and is to, further based on uniquely activated ones of the fourth set of four select signals, select the corresponding one of four input signals to be output. The duty cycle control loop may include detection circuitry to produce first indicators of overlap and underlap of two consecutive phases of the first set of four select signals and second indicators of overlap and underlap of two consecutive phases of the third set of four select signals. The first indicators of overlap and underlap and the second indicators of overlap and underlap may each have a one of a local maxima and local minima when respective signals of two consecutive phases have maximum pulse width with substantially no overlap. The detection circuitry may include at least one exclusive-OR function between respective signals of two consecutive phases of the first set of four select signals and the second set of four select signals.

In one or more embodiments of the present disclosure, a method of operating an integrated circuit is provided. The method may include generating, from N number of clock signals that are substantially phase spaced at 360 degrees divided by N, a first set of N number of select signals, where N is a positive integer greater than three. The method may further include adjusting, using a first duty cycle control loop, respective duty cycles of the first set of N number of select signals to produce a second set of N number of select signals. Based on respectively activated ones of the second set of N number of select signals, the method may also include selecting a corresponding input signal to be output.

One or more of the following features may be included. In some embodiments, the method may include producing overlap/underlap indicators each corresponding to pairs of consecutive phases of the first set of N number of select signals. The overlap/underlap indicators may include local maximums when the pairs of consecutive phases of the first set of N number of select signals have maximized pulse width with minimized overlap. The method may further include using an exclusive-OR type function to produce overlap/underlap indicators. The method may also include generating a third set of N number of select signals that are complementary to the first set of N number of select signals and adjusting, using a second duty cycle control loop, respective duty cycles of the third set of N number of select signals to produce a fourth set of N number of select signals that may be complementary to the second set of select signals. Selecting the corresponding input signal to be output may be further based on respectively activated ones of the fourth set of N number of select signals.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. An integrated circuit, comprising:
   an N-input multiplexor (MUX) including N number of select signals, where N is a positive integer greater than three;
   select signal generating circuitry to receive N number of clock signals at a phase spacing substantially at 360 degrees divided by N, and to produce a first set of N number of select signals; and
   a duty cycle control loop to adjust respective duty cycles of the first set of N number of select signals to produce a second set of N number of select signals to be provided to the N-input MUX.

2. The integrated circuit of claim 1, wherein the duty cycle control loop includes detection circuitry to produce indicators of overlap and underlap of two consecutive phases the first set of N number of select signals.

3. The integrated circuit of claim 2, wherein the indicators of overlap and underlap have at least one of a local maxima and local minima when two of the consecutive phases have maximized pulse width with minimized overlap.

4. The integrated circuit of claim 3, wherein the detection circuitry comprises an exclusive-OR type function between each of the two consecutive phases of the first set of N number of select signals.

5. The integrated circuit of claim 4, wherein the duty cycle control loop includes duty cycle correction circuitry responsive to the indicators of overlap and underlap.

6. The integrated circuit of claim 5, wherein N is equal to four.

7. The integrated circuit of claim 1, wherein the select signal generating circuitry produces a third set of N number of select signals that are complementary to the first set of N number of select signals and the duty cycle control loop is to adjust respective duty cycles of the third set of N number of select signals to produce a fourth set of N number of select signals, complementary to the second set of N number of select signals, to be provided to the N-input MUX.

8. An integrated circuit, comprising:
   select signal generating circuitry to receive four clock signals respectively, the four clock signals substantially phase spaced at 90-degree intervals, and to produce a first set of four select signals; and
   duty cycle correction circuitry responsive to a duty cycle control loop to adjust respective duty cycles of the first set of four select signals to produce a second set of four select signals; and
   a four-input multiplexor (MUX) to receive the second set of four select signals and to, based on respectively activated ones of the second set of four select signals, select a corresponding one of four input signals to be output.

9. The integrated circuit of claim 8, wherein the select signal generating circuitry produces a third set of four select signals that are complementary to the first set of four select signals and the duty cycle correction circuitry, responsive to the duty cycle control loop is to adjust respective duty cycles of the third set of four select signals to produce a fourth set of four select signals that are complementary to the second set of four select signals.

10. The integrated circuit of claim 9, wherein the four input MUX receives the fourth set of four select signals and is to, further based on uniquely activated ones of the fourth set of four select signals, select the corresponding one of four input signals to be output.

11. The integrated circuit of claim 10, wherein the duty cycle control loop includes detection circuitry to produce first indicators of overlap and underlap of two consecutive phases of the first set of four select signals and second indicators of overlap and underlap of two consecutive phases of the third set of four select signals.

12. The integrated circuit of claim 11, wherein the first indicators of overlap and underlap and the second indicators of overlap and underlap each have a one of a local maxima and local minima when respective signals of two consecutive phases have maximum pulse width with substantially no overlap.

13. The integrated circuit of claim 12, wherein the detection circuitry comprises at least one exclusive-OR function between respective signals of two consecutive phases of the first set of four select signals and the second set of four select signals.

14. A method of operating an integrated circuit, comprising:
   generating, from N number of clock signals that are substantially phase spaced at 360 degrees divided by N, a first set of N number of select signals, where N is a positive integer greater than three;

adjusting, using a first duty cycle control loop, respective duty cycles of the first set of N number of select signals to produce a second set of N number of select signals; and based on respectively activated ones of the second set of N number of select signals, selecting a corresponding input signal to be output.

15. The method of claim 14, further comprising:

producing at least one of an overlap or an underlap indicator each corresponding to pairs of consecutive phases of the first set of N number of select signals.

16. The method of claim 15, wherein the at least one of overlap or underlap indicator has local maximums when the pairs of consecutive phases of the first set of N number of select signals have maximized pulse width with minimized overlap.

17. The method of claim 16, further comprising:

using an exclusive-OR type function to produce the at least one of overlap or underlap indicator.

18. The method of claim 17, further comprising:

generating a third set of N number of select signals that are complementary to the first set of N number of select signals; and adjusting, using a second duty cycle control loop, respective duty cycles of the third set of N number of select signals to produce a fourth set of N number of select signals that are complementary to the second set of select signals.

19. The method of claim 18, wherein the selecting the corresponding input signal to be output is further based on respectively activated ones of the fourth set of N number of select signals.

* * * * *